United States Patent
Shukh (10) Patent No.: US 9,236,416 B2
(45) Date of Patent: Jan. 12, 2016

(54) HIGH DENSITY NONVOLATILE MEMORY

(71) Applicant: Alexander Mikhailovich Shukh, San Jose, CA (US)

(72) Inventor: Alexander Mikhailovich Shukh, San Jose, CA (US)

(*) Notice: Subject to any disclaimer, the term of this patent is extended or adjusted under 35 U.S.C. 154(b) by 98 days.

(21) Appl. No.: 14/290,969

(22) Filed: May 29, 2014

(65) Prior Publication Data

US 2014/0353662 A1    Dec. 4, 2014

Related U.S. Application Data

(60) Provisional application No. 61/828,781, filed on May 30, 2013.

(51) Int. Cl.
| | | |
|---|---|---|
| *H01L 43/10* | (2006.01) | |
| *H01L 27/24* | (2006.01) | |
| *H01L 27/22* | (2006.01) | |
| *H01L 45/00* | (2006.01) | |

(52) U.S. Cl.
CPC .......... *H01L 27/2436* (2013.01); *H01L 27/228* (2013.01); *H01L 45/04* (2013.01); *H01L 45/06* (2013.01); *H01L 45/126* (2013.01); *H01L 45/1233* (2013.01); *H01L 45/144* (2013.01); *H01L 45/146* (2013.01); *H01L 45/147* (2013.01)

(58) Field of Classification Search
CPC ..... H01L 27/2436; H01L 45/04; H01L 45/06; H01L 45/1233; H01L 45/126; H01L 45/144; H01L 45/146; H01L 45/147; H01L 27/228
See application file for complete search history.

(56) References Cited

U.S. PATENT DOCUMENTS

| | | | |
|---|---|---|---|
| 5,640,343 A | | 6/1997 | Gallagher et al. |
| 6,838,721 B2 | | 1/2005 | Garni et al. |
| 7,668,005 B2 | | 2/2010 | Ueda |
| 7,813,159 B2 * | 10/2010 | Inaba .................... G11C 11/16 365/148 |
| 7,990,752 B2 * | 8/2011 | Asao ...................... G11C 5/063 365/148 |
| 8,026,521 B1 * | 9/2011 | Or-Bach ............... H01L 21/265 257/67 |
| 8,111,540 B2 * | 2/2012 | Asao ...................... G11C 11/16 365/148 |
| 8,154,905 B2 * | 4/2012 | Inaba .................... G11C 11/16 365/148 |
| 8,174,874 B2 * | 5/2012 | Inaba ...................... G11C 7/18 365/148 |
| 8,331,141 B2 * | 12/2012 | Shukh .................... G11C 11/16 365/148 |
| 8,406,041 B2 | 3/2013 | Shukh |
| 8,411,494 B2 * | 4/2013 | Shukh .................... G11C 11/16 365/148 |
| 8,902,663 B1 * | 12/2014 | Or-Bach ................ G11C 16/02 365/185.08 |
| 8,976,577 B2 * | 3/2015 | Agan ..................... G11C 16/02 365/185.08 |
| 9,070,456 B2 * | 6/2015 | Agan ..................... G11C 11/16 |
| 9,171,601 B2 * | 10/2015 | Shukh ................ G11C 11/1675 |
| 2010/0213458 A1 | 8/2010 | Prall |
| 2014/0252438 A1 * | 9/2014 | Shukh ................ G11C 11/1675 257/295 |
| 2014/0319634 A1 * | 10/2014 | Shukh ................... H01L 27/224 257/427 |
| 2015/0249053 A1 * | 9/2015 | Or-Bach ............. H01L 23/5386 257/401 |

\* cited by examiner

*Primary Examiner* — Michael Zarroli (57) ABSTRACT

A memory cell with a substrate; a first transistor comprising a first gate width and a terminal; resistive memory elements above the transistor, each element comprising an element width, a first and second end; parallel conductive lines above the first memory elements and coupled to the first elements at their first ends; a second plurality of resistive memory elements disposed above the conductive lines, each element comprising the width, the first end, and the second end and coupled to the conductive lines at their first ends; a second transistor disposed above the second plurality of resistive memory elements and comprising a gate width and a terminal, the first memory elements is jointly coupled to the terminal of the first transistor at their second ends; the second memory elements is jointly coupled to the terminal of the second transistor at their second ends; and the gate width is larger than the element width.

17 Claims, 11 Drawing Sheets

HIGH DENSITY NONVOLATILE MEMORY

CROSS-REFERENCE TO RELATED APPLICATIONS

This claims the benefit of provisional patent application U.S. Provisional Patent Application No. 61/828,781 entitled "High Density Magnetic Random Access Memory" filed on May 30, 2013, which is hereby incorporated by reference in its entirety.

FEDERALLY SPONSORED RESEARCH

Not Applicable

SEQUENCE LISTING OR PROGRAM

Not Applicable

RELEVANT PRIOR ART

Garni et al., U.S. Pat. No. 6,838,721, Jan. 4, 2005
Ueda, U.S. Pat. No. 7,668,005, Feb. 23, 2010
Prall, US Patent Application Pub. No. 2010/0213458, Aug. 26, 2010
Shukh, U.S. Pat. No. 8,406,041, Mar. 26, 2013
Shukh, U.S. Pat. No. 8,411,494, Apr. 2, 2013

BACKGROUND

Magnetic random access memory (MRAM) using magnetic tunnel junctions (MTJs) is a strong candidate for providing a dense and fast non-volatile storage solution for future memory applications. Conventional MTJ (or magnetoresistive (MR) element) includes at least a pinned ferromagnetic layer and a free ferromagnetic layer separated from each other by a thin tunnel bather layer. The free layer has a reversible magnetization direction that can have two stable directions which are parallel or anti-parallel to a fixed magnetization direction of the pinned layer. Resistance of the MTJ depends on the mutual orientation of the magnetization directions in the free and pinned layers and can be effectively controlled by an external magnetic field, a spin-polarized current or their combination.

A typical MRAM device includes an array of memory cells, a plurality of parallel word lines extended along columns (or rows) of the array, and a plurality of parallel bit lines extended along rows (or columns) of the memory cells. The word and bit lines overlay each other but spaced from each other in a vertical direction. Each memory cell is located at a cross point of a word line and a bit line, and typically includes a single MTJ connected in series with a selection metal-oxide-semiconductor (MOS) transistor. The connected in series MTJ and selection transistor are electrically coupled to the word line at one terminal and to the bit line at the opposite terminal.

Figure 1:
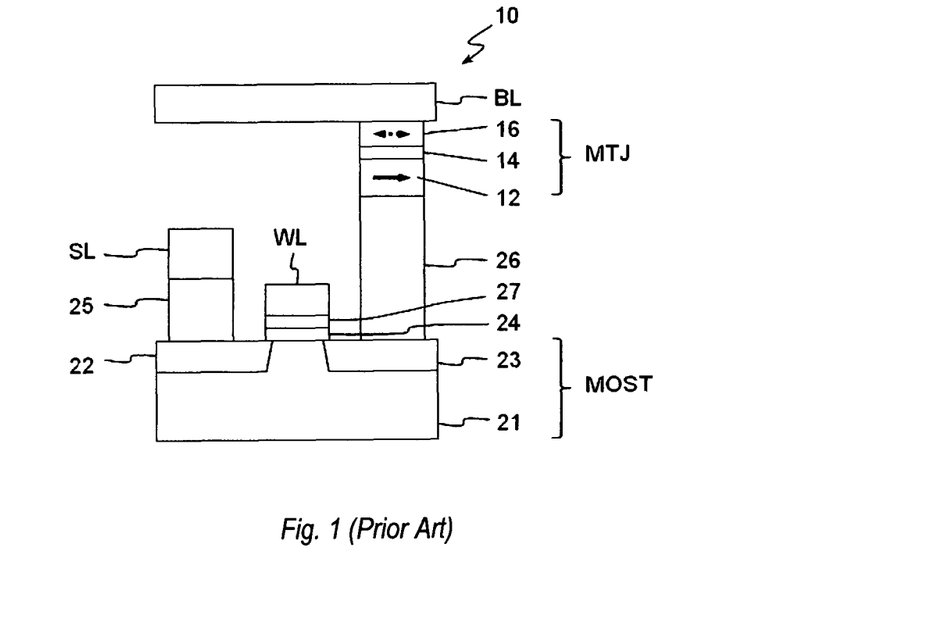
FIG. 1 illustrates a schematic sectional view of a magnetic memory cell employing MOS selection transistor according to prior art.

FIG. 1 shows a memory cell 10 according to a prior art disclosed in U.S. Pat. No. 7,668,005 (Ueda). The cell 10 includes a magnetic tunnel junction (MTJ) connected in series with a MOS transistor (MOST). The MTJ includes a pinned ferromagnetic layer 12 with a fixed magnetization direction (shown by a solid arrow), a free ferromagnetic layer 16 having a reversible magnetization direction (shown by dashed arrows), and a tunnel barrier layer 14 disposed between the ferromagnetic layers 12 and 16. The MTJ is electrically coupled to a bit line BL at a first end and to a drain (or source) terminal (or region) 23 of the transistor MOST at a second end by means of a conductive stud (or contact) 26. A source (or drain) terminal (or region) 22 of the transistor MOST is coupled to a source line (SL) through a conductive stud (or contact) 25. A gate terminal 27 of the transistor is coupled to a word line (WL). The gate terminal is electrically isolated from the MOST transistor by a thin gate insulator 24. The transistor is formed on a substrate 21 that can be made of a single crystal semiconductor material such as silicon (Si), germanium (Ge), GaAs, SiC or similar.

Use of the MOS transistor as a selection element can limit an arrangement of the existing MRAM and similar nonvolatile memories such resistive RAM (RRAM), phase change RAM (PCRAM) and others into high density three-dimensional design due to long interconnects between memory elements and a selection transistor. Moreover, the three-dimensional MOS technology is relatively expensive. The present application addresses the above problems.

SUMMARY

Disclosed herein is a memory cell comprising: a thin film transistor comprising a semiconductor layer, a gate terminal having a gate width, and a first terminal; a plurality of resistive memory elements, each resistive memory element comprising an element width and two stable resistance states; and a plurality of conductive lines overlapping the gate terminal at a plurality of intersection regions and independently electrically coupled to the plurality of resistive memory elements at their first ends, wherein the plurality of resistive memory elements is jointly electrically coupled to the first terminal of the thin film transistor at their second ends, and wherein the gate width is substantially larger than the element width.

Also disclosed is a memory cell comprising: a substrate; a first plurality of resistive memory elements, each resistance memory element comprising an element width and two stable resistance states; a first plurality of parallel conductive lines disposed between the substrate and the first plurality of resistive memory elements and separately electrically coupled to the first plurality of resistive memory elements at their first ends; a second plurality of a resistive memory elements disposed above the first plurality of resistive memory elements, each resistive memory element comprising the element width and two stable resistance states; a second plurality of parallel conductive lines disposed above the second plurality of resistive memory elements and separately electrically coupled to the second plurality of resistive memory elements at their first ends; and a thin film transistor disposed between the first plurality of resistive memory elements and the second plurality of resistive memory elements, comprising a gate width and a terminal, wherein the first plurality of resistive memory elements and the second plurality of resistive memory elements are jointly electrically coupled to the terminal of the thin film transistor, and wherein the gate width is substantially larger than the element width.

DETAILED DESCRIPTION

Embodiments of the present application will be explained below with reference to the accompanying drawings. Note that in the following explanation the same reference numerals denote constituent elements having almost the same functions and arrangements, and a repetitive explanation will be made only when necessary. Since, however, each figure is an exemplary view, it should be noted that the relationship between the thickness and planar dimensions, the ratio of the thicknesses of layers, and the like are different from the actual ones. Accordingly, practical thicknesses and dimensions should be judged in consideration of the following explanation.

Note also that each embodiment to be presented below merely discloses an device for embodying the technical idea of the present application. Therefore, the technical idea of the present application does not limit the materials, shapes, structures, arrangements, and the like of constituent parts to those described below. The technical idea of the present application can be variously changed within the scope of the appended claims.

Refining now to the drawings, FIGS. 2-9, 11 and 12 illustrate exemplary aspects of the present application. Specifically, these figures illustrate MTJ (or MR element) having multilayer structures with perpendicular and in-plane anisotropy in magnetic layers. Respective magnetization directions in the magnetic layers are shown by solid or dashed arrows. The MTJ can store binary data by using steady logic states determined by a mutual orientation of the magnetization directions in the magnetic layers separated by a tunnel bather layer. The logic state "0" or "1" of the MTJ can be changed by a spin-polarized current running through the element in the direction perpendicular to layers surface (or substrate), by an external magnetic field, or by a combination of the spin-polarizing current with the magnetic field. The MTJ may be included as a part of magnetic random access memory (MRAM).

The MTJ herein mentioned in this specification and in the scope of claims is a general term of a tunneling magnetoresistance (TMR) element using a nonmagnetic insulator or semiconductor as the tunnel bather layer. Although the following figures each illustrate the major components of the MTJ, another layer may also be included as long as the arrangement shown in the figure is included.

Figure 2A:
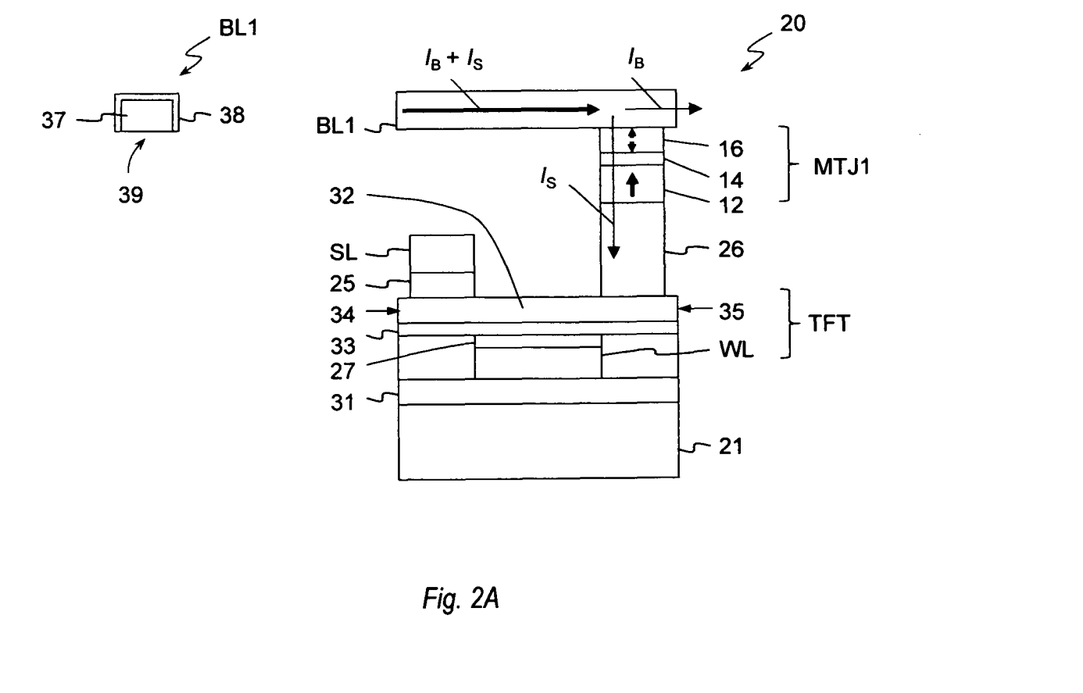
FIGS. 2A and 2B show schematic sectional and top down views, respectively, of a magnetic memory cell with a thin-film transistor according to a first embodiment.
Figure 2B:
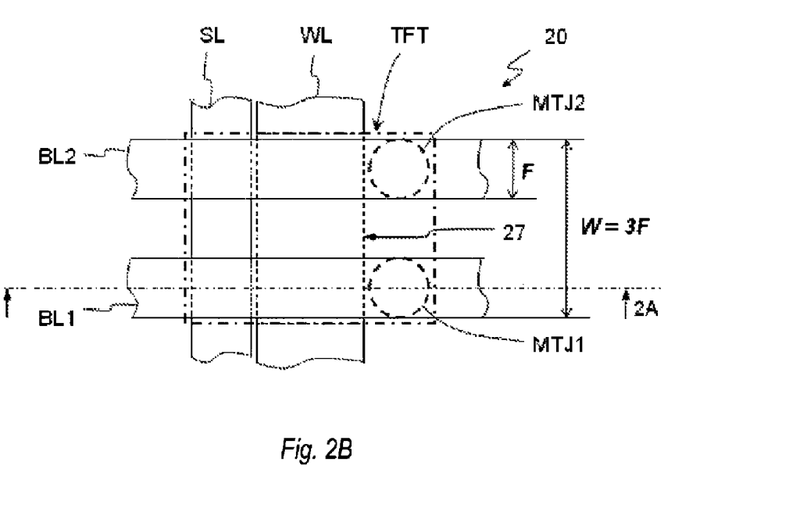

FIGS. 2A and 2B show schematic sectional and top down views, respectively, of magnetic memory cell 20 employing a thin-film transistor TFT. The transistor TFT is formed on a substrate 21 and is electrically isolated from the substrate by a layer of isolative material 31 such as $SiO_2$ having a thickness of about 1 μm. The transistor TFT can include a layer of semiconductor material 32, for example made of polycrystalline silicon (poly-Si) and doped with Phosphorous (P). A thickness of the n-poly-Si is about 100 nm. The transistor has a source region 34 and a drain region 35. A gate terminal 27 is electrically coupled to a word line WL and is electrically isolated from the semiconductor layer 32 by a thin gate insulator 33. The source region 34 of the transistor is coupled to a source line SL by means of a contact 25. The drain region 35 of the transistor TFT is electrically coupled to a first end of the MTJ1 by means of the contact 26. The MTJ1 comprises magnetic materials with a perpendicular anisotropy (a magnetization direction) indicated by arrows. The MTJ1 is electrically coupled to a bit line BL1 at its second end.

Writing to the MTJ1 can be done by using a spin torque transfer mechanism. When a positive signal of a sufficient voltage is applied to the WL (see FIG. 2A), the transistor TFT is on and a spin-polarized current $I_S$ runs through the transistor and MTJ1. At the current direction from the free layer 16 to the pinned layer 12, spin-polarized electrons are moving in the opposite direction, specifically, from the pinned layer 12 to the free layer 16. The electrons can have a polarized spin that is parallel to the magnetization direction in the pinned layer 12. Entering the free layer 16, the spin-polarized electrons can force the magnetization direction of the free layer 16 to be oriented in parallel to the magnetization direction of the pinned layer 12 due to a spin-torque transfer. The parallel orientation of the magnetization directions in the magnetic layers 12 and 16 separated by a nonmagnetic tunnel bather layer 14 corresponds to a lowest resistance state (logic "0") of the MTJ1.

A reverse of the spin-polarized current $I_S$ direction in the MTJ1 (current is running from the pinned layer 12 to the free layer 16) can result in switching of magnetization direction of the free layer 16 in anti-parallel to the magnetization direction of the pinned layer 12. This configuration of the magnetization directions corresponds to a highest resistance state, or to a logic "1".

The bit line BL1 may have a magnetic cladding to provide a possibility of a hybrid write mechanism use. The hybrid write mechanism employs a simultaneous application of a bias magnetic field $H_B$ and spin-polarized current $I_S$ to the MTJ1 during writing. A bias current $I_B$ is supplied to the bit line BL1. This current $I_B$ generates a bias magnetic field $H_B$ that is applied along a hard magnetic axis of the free layer 16. The bias magnetic field can tilt the magnetization direction (vector) of the free layer 16 from its perpendicular direction in an equilibrium state. Tilting of the magnetization direction can provide a substantial reduction of the spin-polarized current $I_S$ required for magnetization direction reversal. Moreover, the hybrid write mechanism can reduce a switching time of the MTJ1. To reduce the bias current $I_B$ the bit line can have a magnetic cladding. A sectional view of the bit line BL1 with the magnetic cladding taken perpendicular to the line length is shown in the insertion of FIG. 2A. The BL1 comprises a conductor 37 cladded with a yoke 38 made of a ferromagnetic material having a high permeability and low coercivity such as NiFe. The yoke 38 includes a non-magnetic gap 39 that is formed on a side of the BL1 adjacent to the MTJ1. The ferromagnetic yoke magnifies the bias magnetic field $H_B$ in the vicinity of the MTJ1. The bias current $I_B$ and spin-polarized current $I_S$ separately cannot reverse the magnetization direction in the free layer 16. The magnetization direction can be reversed only when both currents are applied simultaneously.

FIG. 2B shows a schematic top-down view of the memory cell 20. The cell 20 includes one thin-film transistor TFT (shown by a dash-dot line) and two memory elements MTJ1 and MTJ2 jointly electrically coupled to the drain terminal 35 (see FIG. 2A) of the same transistor at one of their ends. At opposite ends the MTJs are separately connected to different bit lines, for example, the MTJ1 is coupled to the bit line BL1 and the MTJ2 is connected to a bit line BL2. This connection provides a possibility of an independent selection of the MTJs using the common transistor TFT. The transistor TFT can have substantially larger size than the size of the MTJs. Specifically, a gate width W of the transistor TFT can be substantially larger than the width F of the MTJs. For example, in the given exemplary embodiment the gate width W=3F. Hence, the thin-film transistor TFT can be made by using a technology with substantially larger technology node than that is used for MTJ manufacturing.

Figure 3:
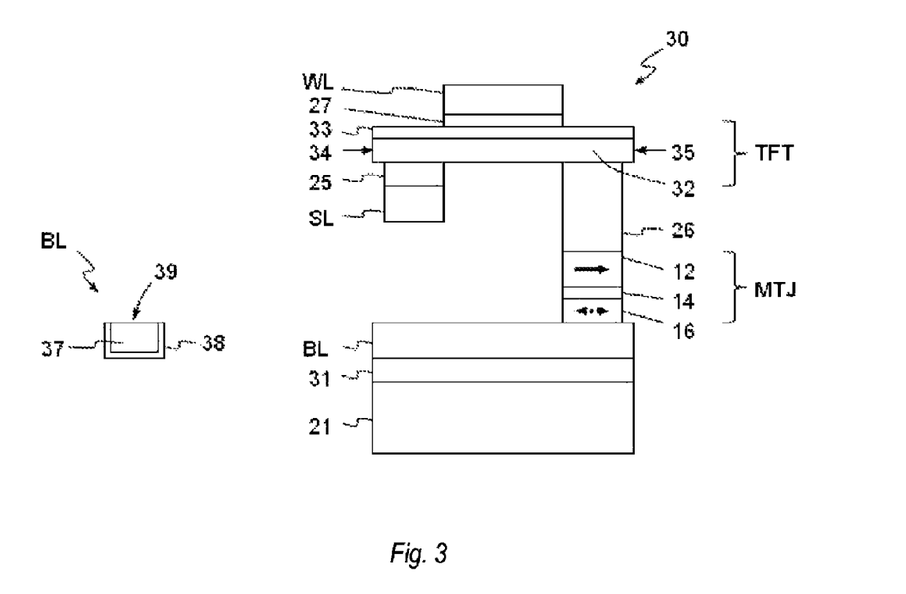
FIG. 3 shows a schematic sectional view of a magnetic memory cell with a thin-film transistor according to a second embodiment.

FIG. 3 shows a schematic sectional view of a memory cell 30 employing a thin-film transistor TFT disposed above the MTJ. The MTJ can use magnetic materials with in-plane magnetization direction in the pinned 12 and free 16 ferromagnetic layers (illustrated by arrows). The bit line BL can be disposed on the substrate 21 above the insulator layer 31. The BL can include a conductor 37, a magnetic cladding (yoke) 38 with a non-magnetic gap 39 being disposed adjacent to the MTJ, and more specifically, to the free ferromagnetic layer 16. The transistor TFT is electrically isolated from the MTJ by an insulator (not shown). The TFT can comprise a semiconductor layer 32, a source region 34, and a drain region 35. The number of MTJs connected to the drain region 35 of the TFT transistor by means of a contact 26 can be any including one. The source region 34 is coupled to a source line SL through a contact 25. A gate terminal 27 is coupled to a word line WL and is placed above the semiconductor layer 32 of the transistor. Note that the gate terminal 27 can be disposed above or below the semiconductor layer 32.

Figure 4:
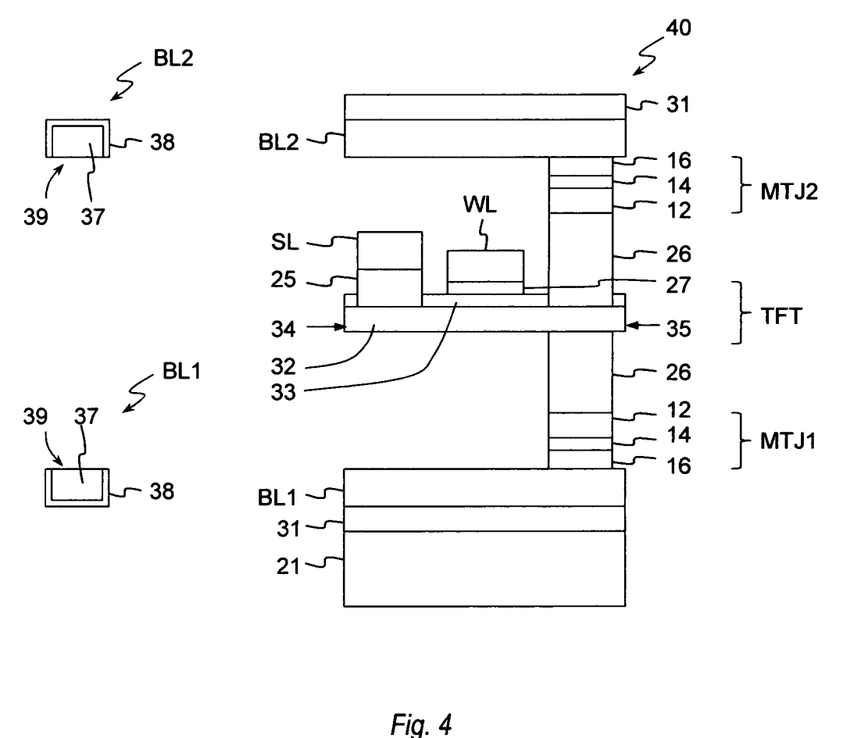
FIG. 4 shows a schematic sectional view of magnetic memory cell arranged in a three-dimensional architecture with a thin-film selection transistor coupled to several magnetic tunnel junctions according to a third embodiment.

FIG. 4 shows a schematic sectional view of a three-dimensional memory cell 40. The cell 40 can include a TFT transistor disposed in a vertical space between MTJ1 and MTJ2. The cell 40 is formed on a substrate 21 that can comprise an insulator layer 31. Each of the memory elements MTJ1 and MTJ2 can comprise a pinned layer 12, a tunnel barrier layer 14, and a free layer 16. The MTJ1 and MTJ2 at one ends are jointly electrically coupled to a drain region (terminal) 35 of the transistor TFT by means of the contacts (conductive studs) 26. A source region 34 of the transistor TFT is coupled to a source line SL through a contact 25. A conductivity of the semiconductor layer 32 is control by a voltage applied to a gate terminal 27 that is electrically coupled to a word line WL. The gate terminal 27 is spaced from the semiconductor layer 32 by a thin gate insulator layer 33. The other ends of the MTJ1 and MTJ2 are independently electrically coupled to bit lines BL1 and BL2, respectively. The bit lines BL1 and BL2 are disposed adjacent to free layer 16 of the MTJ1 and MTJ2, respectively. Each of the bit lines BL1 and BL2 can comprise a conductor 37, a ferromagnetic cladding 38, a nonmagnetic gap 39. Note that nonmagnetic gaps 39 of the bit lines BL1 and BL2 are facing the MTJ1 and MTJ2, respectively. This architecture provides an independent selection of the MTJ1 and MTJ2 connected to the same transistor TFT in the array and substantial increase a density of the MTJs on the substrate 21.

Figure 5:
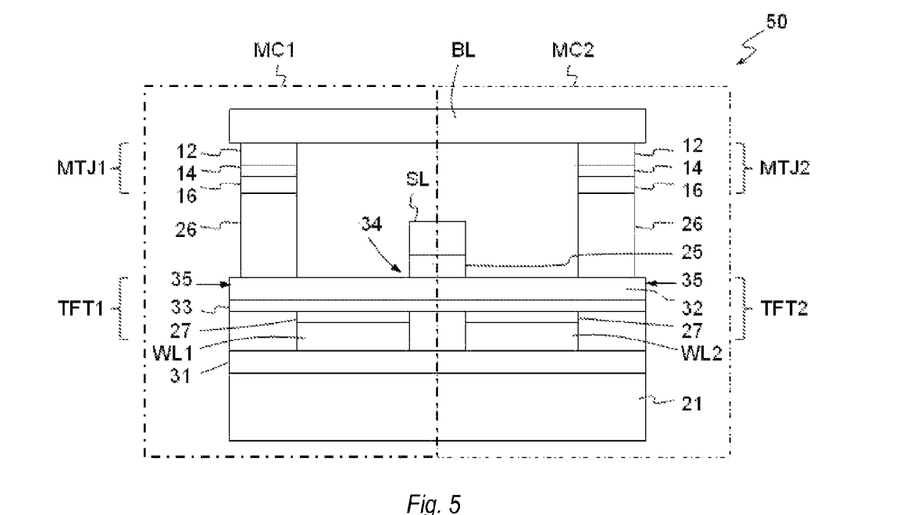
FIG. 5 is a schematic sectional view of magnetic memory cells with thin-film selection transistors according to a fourth embodiment.

FIG. 5 illustrates a schematic sectional view of a memory design 50 comprising two memory cells MC1 and MC2. The memory 50 is disposed on a substrate 21 that can comprise an insulator layer 31. The memory cell MC1 can include a selection transistor TFT1 and a MTJ1. Respectively, the memory cell MC2 can include a transistor TFT2 and MTJ2. Each of the MTJ1 and MTJ2 can comprise a pinned layer 12, a tunnel barrier layer 14, and a free layer 16. The transistors TFT1 and TFT2 can have a common source region 34 that is electrically coupled to a source line SL through a contact 25. Drain regions of the transistors TFT1 and TFT2 are separately electrically coupled through contacts 26 to one end of the MTJ1 and MTJ2, respectively. The opposite ends of the MTJ1 and MTJ2 are electrically coupled to a common bit line BL. A selection of the MTJ is provided by applying of a signal to the word line WL (gate terminal 27) of the appropriate thin-film transistor. For example, to select the MTJ1 the signal should be applied to the word line WL1 coupled to the gate 27 of the transistor TFT1. Each gate terminal 27 is separated from the semiconductor layer 32 by a gate insulator layer 33.

Figure 6:
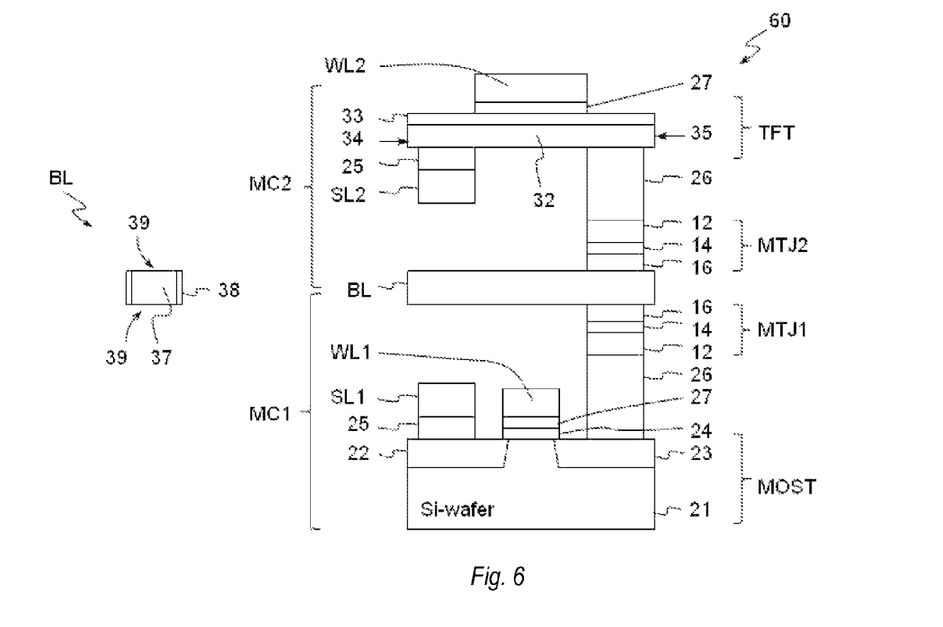
FIG. 6 shows a schematic sectional view of a magnetic memory cell arranged in a three-dimensional architecture with MOS and thin-film selection transistors according to a fifth embodiment.

FIG. 6 shows a schematic sectional view of a memory design 60 comprising two memory cells MC1 and MC2 arranged in three-dimensional architecture. The memory cell MC1 can include a MTJ1 electrically coupled to a MOS transistor MOST disposed on the semiconductor substrate 21 made, for example, of a single crystal Si. The memory cell MC2 can comprise a MTJ2 electrically coupled to a thin-film transistor TFT comprising a layer 32 of a semiconductor material such as poly-Si or similar. The MTJ1 and MTJ2 are jointly electrically coupled to a bit line BL at their ends adjacent to their free layers 16. Another ends of the MTJ1 and MTJ2 can separately be coupled to the transistors MOST and TFT, respectively. Each of the MTJ1 and MTJ2 can comprise a pinned layer 12, a tunnel barrier layer 14, and the free layer 16, and can be coupled by means of a contact 26 to a drain terminal 23 or 35 of the appropriate MOST or TFT transistor, respectively. The MOST transistor can comprise a gate terminal 27 and a source region 22 electrically coupled to a source line SL1 through a contact 25. A gate terminal 27 of the MOS transistor can be coupled to a word line WL1 through a gate insulator layer 24. The TF1 transistor can comprise a source region 34 coupled to a source line SL2 through the contact 25, and the gate terminal 27 coupled to a word line WL2 through a gate insulator layer 33. The bit line BL may have a ferromagnetic cladding 38 with two non-magnetic gaps 39 disposed on opposite sides of a conductor 37 adjacent to the MTJ1 and MTJ2. Note that the bit line BL can be made without the ferromagnetic cladding 38. Two writing mechanism can be used for writing to the MTJ1 and MTJ2: spin-induced and hybrid writing. Also the bit line BL may have only one non-magnetic gap adjacent to MTJ1 or MTJ2 for providing a different magnitude of the spin-polarized switching current $I_{S1}$ or $I_{S2}$ supporting writing to the MTJs. The magnitudes of the spin-polarized switching currents $I_{S1}$ and $I_{S2}$ depend on geometry and material properties of the free layers of the MTJ1 and MTJ2, respectively. A gate width of the MOS transistor MOST and thin film transistor TFT can be substantially larger than a width of the MTJ1 and MTJ2. Note, that MOS and thin film transistors may have different gate widths.

Figure 7:
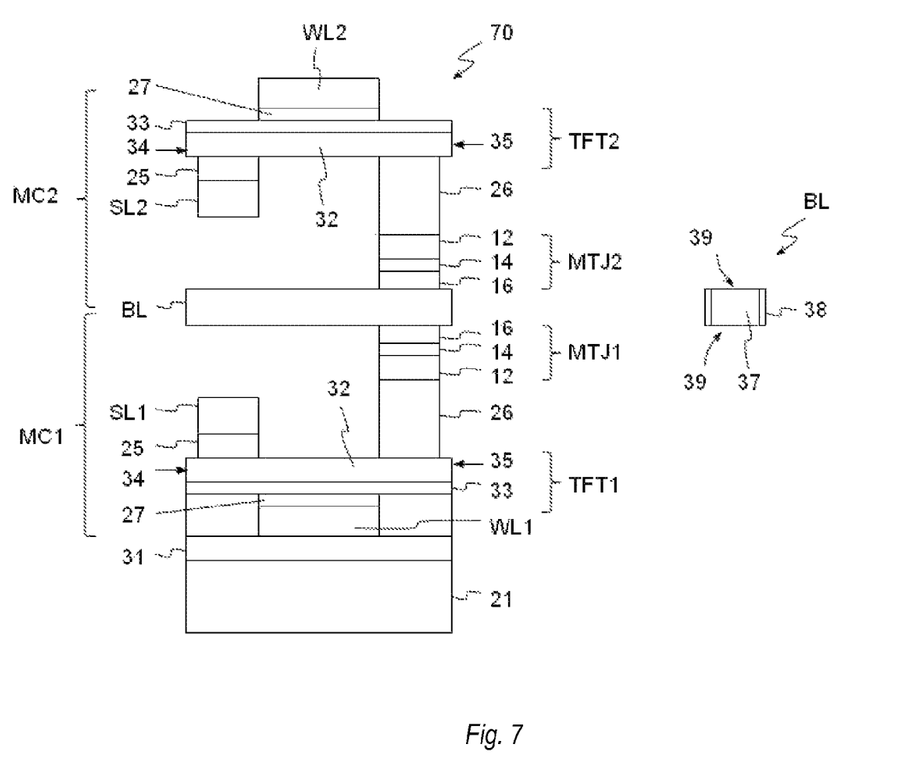
FIG. 7 shows a schematic sectional view of a magnetic memory cell arranged in a three-dimensional architecture with thin-film selection transistors according to a sixth embodiment

FIG. 7 illustrates a schematic sectional view of another memory design 70 with a three-dimensional architecture of memory cells. The memory design 70 distinguishes from the design 60 shown in FIG. 6 employing two thin-film transistors TFT1 and TFT2. Each of the TFT transistors can include a semiconductor layer 32 comprising a source region 34 and drain 35 region, and a gate terminal 27. The gate terminal 27 can be separated from the semiconductor layer 32 by a gate insulator layer 33. The transistor TFT1 is disposed below a MTJ1 and connected in series with the MTJ1. The TFT1 provides a control of a logic state of the MTJ1. The transistor TFT2 is coupled in series with MTJ2 and is disposed above the MTJ2. The transistors TFT1 and TFT2 can have different architectures. For example, the TFT1 can have a word line WL1 coupled to the gate terminal 27 that is disposed below the semiconductor layer 32. The TFT2 can have a word line WL2 placed above the semiconductor layer 32. Note that the position of the word lines WL1 and WL2 (the gate terminals 27) of the transistors TFT1 and TFT2, respectively, can be any. Each of the MTJ1 and MTJ2 can comprise a pinned layer 12, a tunnel barrier layer 14, and a free layer 16. The MTJ1 and MTJ2 are electrically coupled to opposite sides of the bit line BL at their ends adjacent to the free layers 16. The bit line BL can have a ferromagnetic cladding 38 with two non-magnetic gaps 39 formed on opposite sides of a conductor 37 and positioned adjacent to the MTJ1 and MTJ2.

Figure 8:
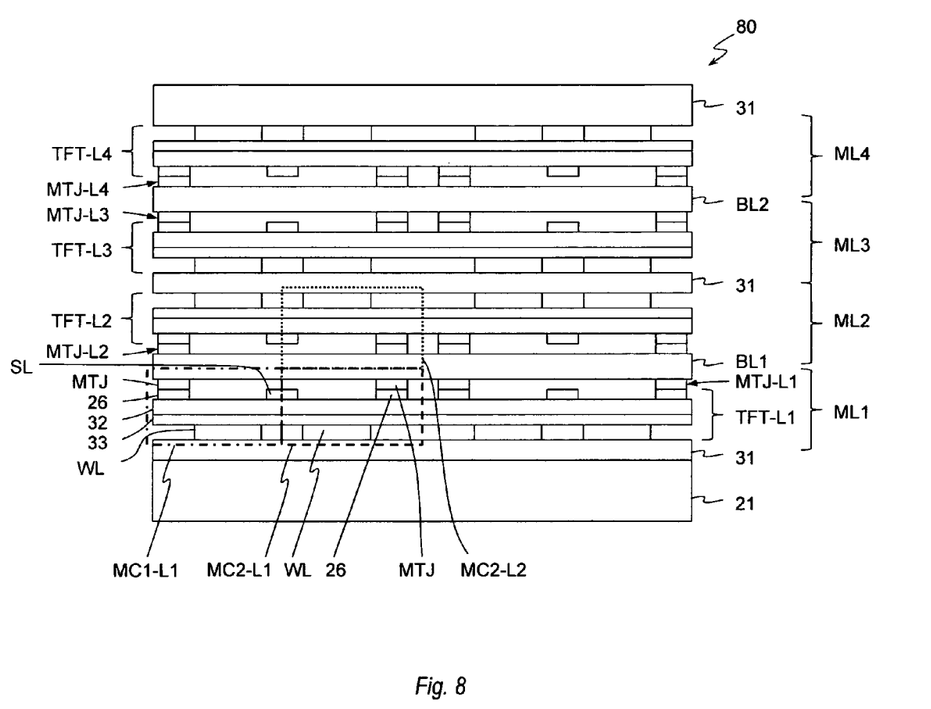
FIG. 8 is a schematic sectional view of a three-dimensional magnetic random access memory with thin-film selection transistors according to a seventh embodiment.

FIG. 8 illustrates one of the several possible embodiments of a memory 80 comprising four memory layers ML1-ML4. Each of the memory layers can comprise one layer of TFTs and one layer of MTJs. For example, the memory layer ML1 comprises a layer of thin-film transistors TFT-L1 electrically coupled to a layer of magnetic tunnel junction MTJ-L1. Respectively, the memory layer ML2 comprises the layers TFT-L2 and MTJ-L2 coupled to each other and the like for the memory layers ML3 and ML4. The memory layers ML1-ML4 are formed on a substrate 21 than can be covered by an insulator layer 31. The insulator layer 31 can be also disposed between the memory layers, for example, between the ML2 and ML3, and above the top memory layer ML4. In the memory layers ML1 and ML3 the layers TFT-L1 and TFT-L3 are disposed underneath the layers MTJ-L1 and MTJ-L3, respectively. Contrarily, in the memory layers ML2 and ML4 the layers of the transistors TFT-L2 and TFT-L4 are formed above the layers of MTJ-L2 and MTJ-L4, respectively. Memory cells MC1-L1 (highlighted by a dash-dot line) and MC2-L1 (highlighted by a dash line) of the memory layer ML1 can have a design shown in FIG. 5 wherein two adjacent transistors have a common selection line SL (source region) but independent word lines WL and drain regions coupled to appropriate memory elements MTJ through contacts 26. The TFT transistors disposed in the same memory layer can have common semiconductor layer 32 and gate insulator layer 33. Memory cells MC2-L1 and MC2-L2 (highlighted in dot line) can have a common bit line BL1 (see FIG. 7). The cells MC2-L1 and MC2-L2 are disposed in the different memory layers ML1 and ML2. The free layers of the MTJ-L1 and MTJ-L2 can be disposed adjacent to the bit line BL1. The bit line BL1 can have a magnetic cladding with two non-magnetic gaps facing the MTJs. The memory layer ML2 is electrically isolated from the memory layer ML3 by an insulator layer 31. The memory layers ML3 and ML4 are electrically coupled to a common bit line BL2 similar to the layers ML1 and ML2 having the bit line BL1 in common. The exemplary memory 80 includes four memory layers ML1-ML4. Note that the number of the memory layers can be any.

Figure 9:
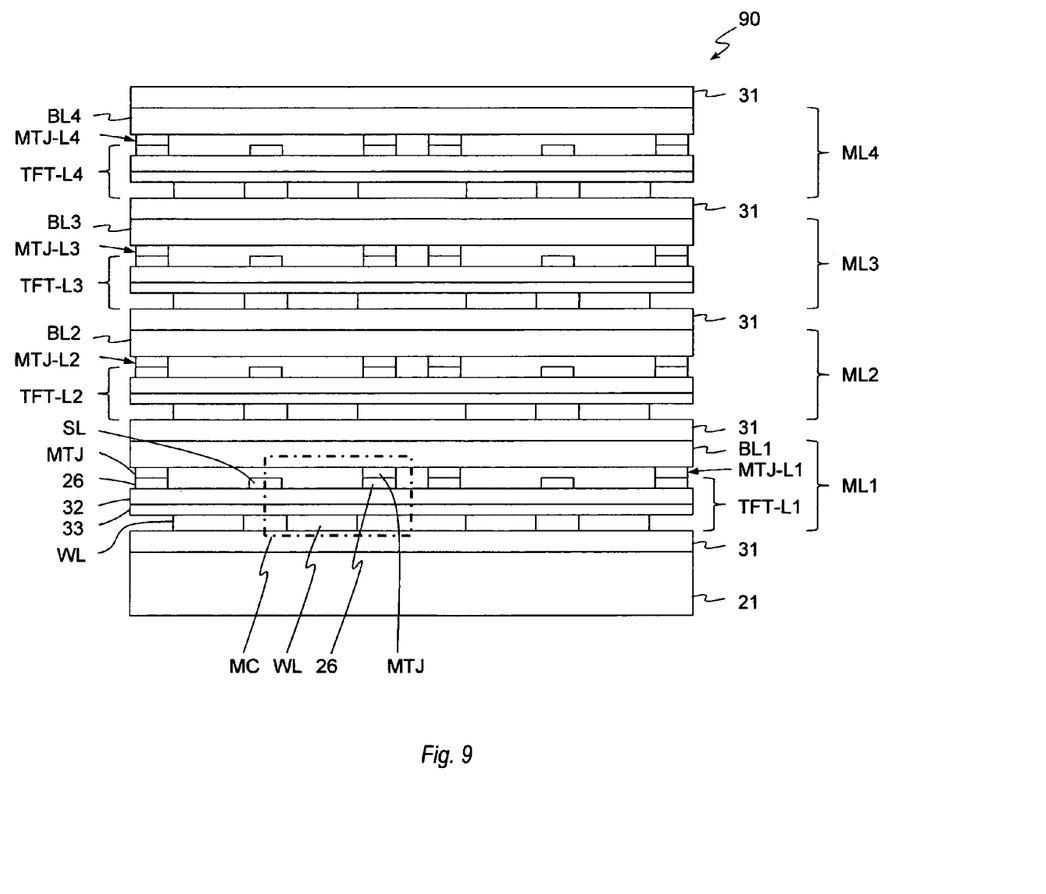
FIG. 9 is a schematic sectional view of a three-dimensional magnetic random access memory with thin-film selection transistors according to an eighth embodiment.

FIG. 9 shows another possible configuration of the layers of thin-film transistors and magnetic tunnel junctions arranged in a three-dimensional architecture. A memory 90 can comprise four memory layers ML1, ML2, ML3, and ML4. Note that the number of the memory layers can be any. Each memory layer can include a layer of thin-film transistors TFT, a layer of magnetic tunnel junctions MTJ, a layer of parallel bit lines BL, and an insulator layer 31. For example, the memory layer ML1 can include a transistor layer TFT-L1, a junction layer MTJ-L1, a bit line layer BL1, and the insulator layer 31. The transistor layer TFT-L1 can be disposed underneath the junction layer MTJ-L1. The magnetic tunnel junctions of the layer MTJ-L1 can be electrically coupled by means of contacts 26 to the appropriate transistors of the layer TFT-L1 at their first end and to the bit lines at their second end. The transistors of the memory 90 can have a design shown in FIG. 5. A memory cell MC is highlighted by a dash-dot line. The memory cell can comprise an independent word line WL, and semiconductor 32 and gate insulator 33 layers that are common for all cells of the memory layer. Note that the design of the thin-film transistors can be any. The bit lines BL1-BL4 can have a magnetic cladding with a non-magnetic gap positioned adjacent to a free layer of the MTJs. In the given exemplarily embodiment the transistors are disposed underneath the appropriate magnetic tunnel junctions. Note that the position of the transistors relatively to the magnetic tunnel junctions can be any.

Figure 10:
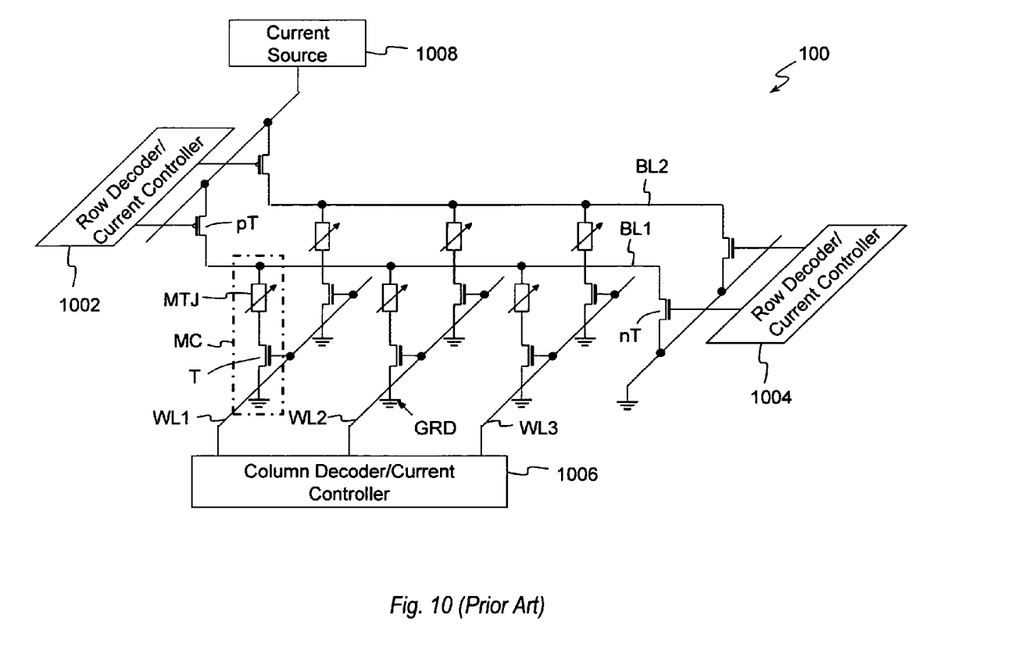
FIG. 10 is a circuit block diagram illustrating a magnetic random access memory according to prior art.

FIG. 10 shows a circuit block diagram of a magnetic random access memory (MRAM) 100 according to prior art. The memory 100 includes an array of memory cells MC disposed between overlapping pluralities of parallel bit BL1-BL2 and parallel word WL1-WL3 lines. The overlapping bit and word lines form a plurality of intersection regions where the memory cells are disposed. Each memory cell MC (highlighted by a dash-dot line) can include one MTJ and one transistor T connected in series. The MTJ is electrically connected to the transistor T at one end and to the bit line BL1 at another end. Opposite ends of the bit lines are connected to row decoder/current controllers 1002 and 1004 through p-type (pT) and n-type (nT) transistors, respectively. Source terminals of the p-type transistors pT are connected to a current source 1008. Source terminals of the n-type transistors nT are connected to a ground terminal (GRD) or to a source line SL (not shown). Gate terminals of the selection transistors T are connected to a column decoder/current controller 1006. The memory 100 has a "one transistor-one MTJ" (1T-1MTJ) cell design. This design cannot provide a required switching current $I_S$ at technology node above 45 nm due to a transistor saturation when magnetic materials having in-plane magnetic anisotropy are used. To overcome this issue two transistors per one MTJ are frequently used (2T-1MTJ design). It limits substantially a density of the memory 100.

Figure 11:
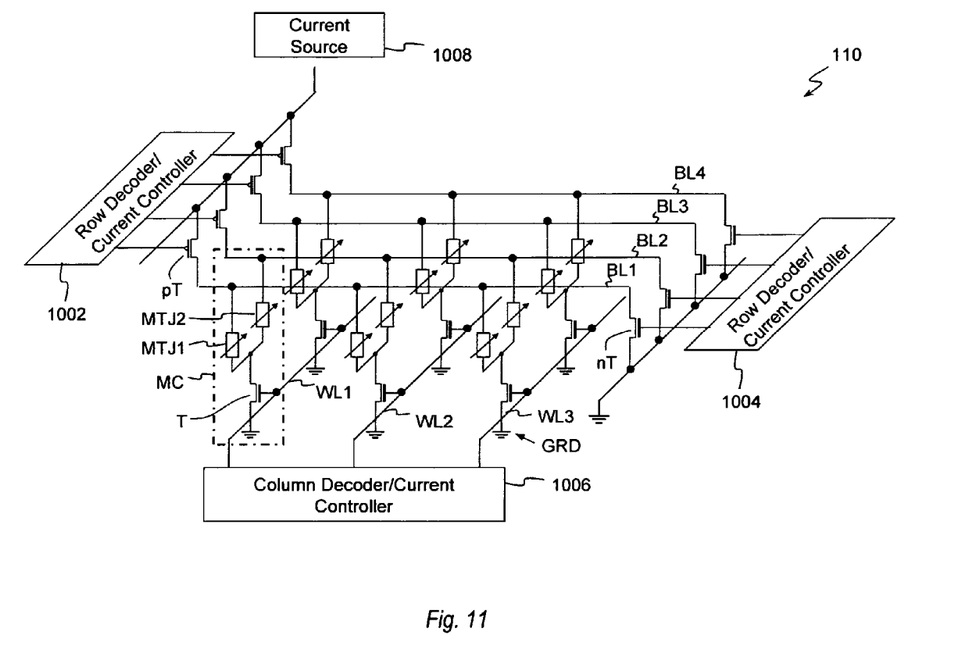
FIG. 11 is a circuit block diagram illustrating a magnetic random access memory employing the memory cells shown in FIGS. 2A and 2B, and FIG. 4.

FIG. 11 shows a circuit block diagram of a memory 110 according to an embodiment of the present application. The memory 110 includes an array of memory cells MC arranged in rows and columns. Each memory cell MC (highlighted by a dash-dot line) can include a selection transistor T and two magnetic tunnel junctions MTJ1 and MTJ2 (see FIGS. 2A and 2B, and FIG. 4). The transistor can be made using MOS technology on a single-crystalline semiconductor substrate such as Si (MOST) or using a thin semiconductor film such as poly-Si (TFT). The MTJ1 and MTJ2 can be jointly electrically coupled to the transistor T at their first ends and separately connected to different conductive bit lines BL1 and BL2 at their second ends. This connection provide a possibility of an independent selection of the MTJ in the array of the memory 110. The number of MTJs in the memory cell MC shown in the exemplary embodiment is equal to two, but it can be any. Opposite ends of the bit lines BL1-BL4 can be coupled to a current source 1008 and ground through p-type pT and n-type nT transistors, respectively. Gate terminals of the pT transistors can be coupled to a row decoder/current controller 1002. Respectively, gate terminals of the nT transistors can be coupled to a row decoder/current controller 1004. Gate terminals of the selection transistors T can be coupled to a column decoder/current controller 1006 by means of word lines WL1-WL3.

Data can be written to the MTJs by using a spin momentum transfer mechanism when a spin-polarized current $I_S$ is running through the MTJ in a direction perpendicular to a substrate. The data also can written by using a hybrid write mechanism that employs a joint effect of a bias current $I_B$ and the spin-polarized current $I_S$ applied simultaneously to the selected MTJ. The memory 110 shown in FIG. 11 can include one layer of selection transistors and one layer of magnetic tunnel junctions. Note that the number of the layers can be any. The numbers of the transistors layers and MTJ layers in the memory 110 can be not equal to each other. For example, the number of MTJ layers can be higher than the number of the transistors layers and vice versa. For example, one layer of TFTs can be combined with two layers of MTJs (see FIG. 4).

Figure 12:
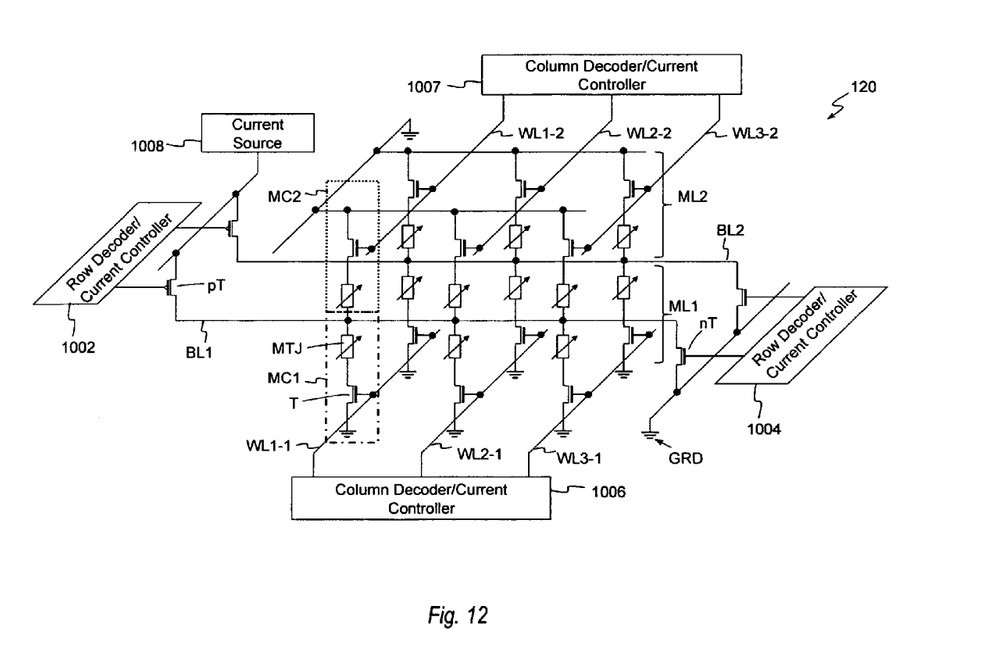
FIG. 12 is a circuit block diagram illustrating a magnetic random access memory employing memory cells shown in FIG. 6 and FIG. 7.

FIG. 12 illustrates a circuit block diagram of a memory 120 according to another embodiment of the present application. The memory 120 can comprise two memory layers ML1 and ML2, and pluralities of bit and word lines shown in FIG. 8. The memory layers ML1 and ML2 have common bit lines BL1-BL2 but independent pluralities of the word lines WL1-1-WL3-1 and WL1-2-WL3-2, respectively. Each memory layer ML can comprise a layer of memory elements MTJ and a layer of selection transistors T. The memory cells MC1 and MC2 of the memory layers ML1 and ML2, respectively can be jointly coupled to a bit line BL1 which is disposed between the memory layers. The bit lines BL1 and BL2 can be coupled to a source current 1008 at their first end and to a ground at their second end through p-type pT and n-type nT MOS transistors, respectively. Gate terminals of the pT transistors can be coupled to a row decoder/current selector 1002. Respectively, gate terminals of the nT transistors can be coupled to a row decoder/current selector 1004. Gate terminals of the selection transistors T of the memory layer ML1 can be coupled to a column decoder/current controller 1006 through word line WL1-1. Respectively, gate terminals of the selection transistors of the memory layer ML2 can be coupled to a column decoder/current controller 1007 by means of the word line WL1-2. Various nonvolatile reversible memory elements (RME) can be used instead of the MTJs in the embodiments. For example, the MTJ can be replaced by a RME that is used in a resistive random access memory (RRAM or ReRAM), in a phase-change random access memory (PRAM or PCRAM), in a conductive bridging random access memory (CBRAM), or in other similar memory device. In the above embodiments the MTJs are shown for exemplarily purpose. Three dimensional memory cells may comprise different types of RME in different layers. For example, a bottom layer of the memory elements can comprise MTJs and top layer of RMEs can include transition metal oxide elements used in RRAM.

Figure 13:
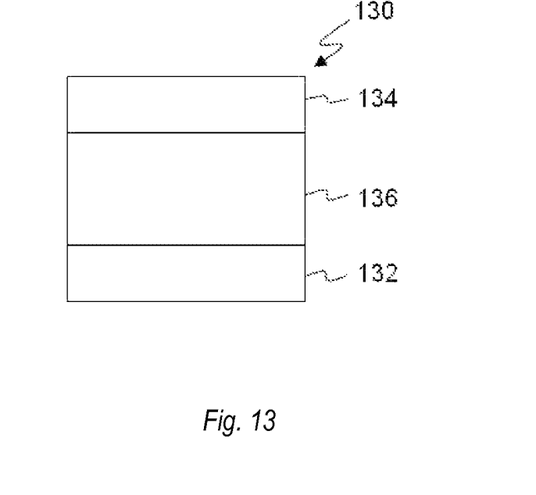
FIG. 13 is a schematic sectional diagram of a nonvolatile resistive memory element.

FIG. 13 illustrates a schematic sectional view of a nonvolatile resistive memory element 130 used in RRAM. A resistance (a logic state) of the element 130 can be changed by a reversal of current running through the element, or by a reversal of a voltage polarity applied to the resistance element. The nonvolatile resistive memory element employs a transition metal oxide (TMO). The memory element can comprise a first electrode 132, a second electrode 134, and a storage layer 136 interposed between the electrodes.

The storage layer 136 can be made of transition metal oxides such as include $Ni_xO_y$, $Ti_xO_y$, $Cu_xO_y$, $Ti_xO_y$, $V_xO_y$, $Zr_xO_y$, $Hf_xO_y$, $Ta_xO_y$, $W_xO_y$, $Fe_xO_y$, $Co_xO_y$, $Zn_xO_y$ and/or similar materials, perovskite-like metal oxides such as $Pr_{0.7}Ca_{0.3}MnO_3$, $SrTiO3$, $NbSrTiO_3$, $NbSrZrO_3$ $CrSrZrO3$, $CrSrTiO_3$ and/or similar materials, or binary metal oxides. The first 132 and second 134 electrodes can be made of materials consisting of a group that includes but is not limited to Ti, Ni, Cu, Ru, Pd, Ag, W, Ir, Pt, Au, Al, their based alloys and laminates.

Figure 14:
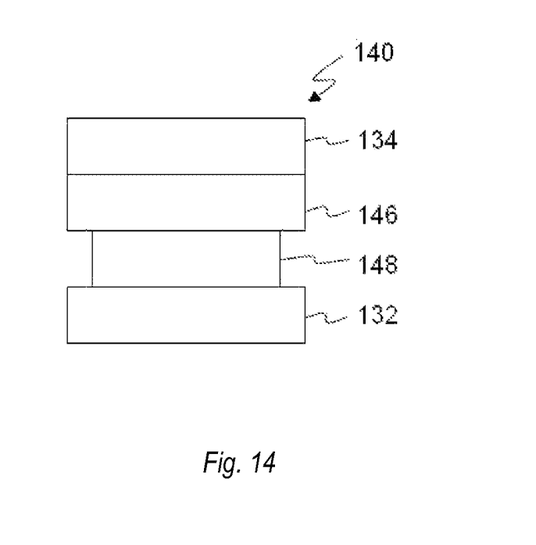
FIG. 14 is a schematic sectional diagram of a nonvolatile phase change memory element.

FIG. 14 shows a schematic sectional view of the RRE that is a chalcogenide element which is used in the phase change random access memory (PCRAM). The chalcogenide element 140 can comprise a first electrode 132, a heater layer 148, a storage layer 146, and a second electrode 134 that are stacked in order. An area of the first electrode 152 can be greater than that of the heater layer 148. The second electrode 134 can have the same shape as the storage layer 146.

The resistance of the storage layer 146 depends on a crystal structure of the layer. The resistance is low when the layer 146 has a polycrystalline structure (logic "0"), and the resistance is high when the layer 146 has an amorphous structure (logic "1"). The crystal structure of the storage layer 146 can be controlled by a magnitude and duration of a current pulse applied to the storage layer 146, such that the storage layer can have a polycrystalline or amorphous structure.

The storage layer 146 can be made of a phase-change material, which can be set into a polycrystalline or amorphous state by a heat generated during writing. The material of the storage layer 146 can include a chalcogenide material such as GeSbTe, InSbTe, AgInSbTe, GeSnTe, GeSb, GeTe, AgSbSe, SbSe, SbTe, InSe, TeAsSiGe and similar.

The heater layer 148 has a direct contact with the storage layer 146. An area of the heater layer 148 can be smaller than the area of the storage layer 146. It allows to reduce a write current and a size of an active area in the storage layer 146. The heater layer 148 can be made from a conductive material selected from a group consisting of TiN, TiAlN, TiBN, TiSiN, TiW, Ti, TaN, TaAlN, TaBN, TaSiN, Ta, WN, WAlN, WBN, WSiN, ZrN, ZrAlN, ZrBN, ZrSiN, MoN, Mo, Al, Cu, AlCu, AlCuSi, WSi and similar. Moreover, the heater layer 148 may be made of the same material as the first electrode 132. The material of the first electrode 132 and the second electrode 134 can include a metal having a high melting point such as Ta, Mo, W, Ti and similar.

There is wide latitude for the choice of materials and their thicknesses within the embodiments of the present disclosure.

The pinned layer 12 can have a thickness of about 1-100 nm and, more specifically, of about 3-50 nm, and coercivity measured along its easy axis of about 1000 Oe or higher and more specifically of about 2000-5000 Oe. The layer 12 can contains at least one element selected from the group consisting of Co, Fe or Ni, their based alloys such as FePt, FePd, CoFeB, FeB, CoFeCrB, CoFeVB or similar, and/or their based laminates such as CoFe/CoFeTb, CoFeB/CoGd, Fe/TbFe, CoFe/Ta, CoFeB/W, CoFeB/Cr, Co/Pt, Co/Pd, Co/Au, CoFe/Pt, Fe/Pt, Fe/Pd, Ni/Cu or similar. The pinned layer can have a perpendicular or in-plane magnetic anisotropy.

The free layer 16 can have a thickness of about 1-5 nm and, more specifically, of about 1.5-2.5 nm, and coercivity less than 1000 Oe and, more specifically, of about 50-200 Oe. The free layer 16 can be made of a magnetic material containing at least one element selected from the group consisting of Co, Fe or Ni, their based alloys such as CoFeB, FeB, CoFeCrB, CoFeVB, FeCrB, FeVB or similar, and/or laminates such as CoFeB/(CoFe/Pt), CoFeB/(Co/Pd), CoFe/W, CoFeB/Ta, CoFeB/Cr, Co/Pt, Co/Pd, Co/Au, CoFe/Pt, Fe/Pt, Fe/Pd, Ni/Cu or similar. The free layer can have a perpendicular or in-plane magnetic anisotropy.

The tunnel barrier layer 14 can have a thickness of about 0.5-2.5 nm and, more specifically, of about 0.8-1.3 nm. The tunnel barrier layer can contains at least one element selected from the group consisting MgO, $Al_2O_3$, $Ta_2O_5$, $TiO_2$, Mg—MgO, $ZrO_X$, and similar materials and/or their based alloys or laminates.

The insulator layer 31 can be made of $SiO_2$, $Al_2O_3$, SiN, and other similar materials and/or their based laminates, or polymer films such as backed photo-resist, polyimide and other similar materials. Thickness of the insulator layer 31 can be in a range from about 50 nm to 5 μm.

A semiconductor layer 32 can be made of poly-Si, Ge, SiC, SiGe, AlSb, AlAs, GaSb, GaAs, GaN, InSb, InAs, InN, InP, $Al_xGa_{1-x}As$, $In_xGa_{1-x}As$, InGaP, AlInAs, AlInSb, GaAsN, GaAsP, AlGaN, AlGaP, InGaN, InAsSb, InGaSb, AlGaInP, also InAlGaP, InGaAlP, AlInGaP, AlGaAsP, InGaAsP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, CZT, HgCdTe, HgZnTe, HgZnSe, CuCl, PbSe, PbS, PbTe, SnS, SnTe, PbSnTe, $Tl_2SnTe_5$, $Tl_2GeTe_5$, $Bi_2Te_3$, $Cd_3P_2$, $Cd_3As_2$, $Cd_3Sb_2$, $Zn_3P_2$, $Zn_3As_2$, $Zn_3Sb_2$, $SnO_2$, $In_2O_3$, CdO, $Cu_2O$, $InGaO_X$, $InGaZnO_X$, $(In,Sn)_2O_3$, $Zn_xSnO_2$, ZnO, InZnO, $AgSbO_3$, $2CdO.GeO_2$, $2CdO.PbO$, $CdS.In2S_x$, $TiO_2$, $SrTiO_3$, $MoO_3$, $(In,Sn)_2O_3/TiO_2$, and similar. A thickness of the semiconductor layer 32 can be in a range from about 3 nm to 1000 nm, and, more specifically, in the range from about 10 nm to 50 nm.

A gate insulator layer 33 can be made of $SiO_2$, SiON, $SiN_x$, alumina, or other similar materials. A thickness of the gate insulator layer can be in a range from about 5 nm to 1000 nm, and, more specifically, in a range from about 20 nm to 100 nm.

The bit BL and word WL conductor lines can be made of Cu, Al, Au, Ag, AlCu, Ta/Au/Ta, Cr/Cu/Cr, poly-Si and/or similar materials and/or their based alloys or laminates.

While the specification of this application contains many specifics, these should not be construed as limitations on the scope of the application or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above application is intended to be illustrative, and not restrictive. Many other embodiments will be apparent to those of skill in the art upon reviewing the above description. The scope of the embodiments should be, therefore, determined with reference to the appended claims, along with the full scope of equivalents to which such claims are entitled.

What is claimed is:

1. Memory cell comprising:
    a thin film transistor comprising a semiconductor layer, a gate width, and a terminal;
    a plurality of resistive memory elements, each resistive memory element comprising an element width and two stable resistance states; and
    a plurality of conductive lines overlapping the terminal at a plurality of intersection regions and independently electrically coupled to the plurality of resistive memory elements at their first ends,
    wherein the plurality of resistive memory elements is jointly electrically coupled to the terminal at their second ends, and wherein the gate width is substantially larger than the element width,
    wherein the resistive memory element is a magnetoresistive element,
    wherein the magnetoresistive element comprises:
    a free ferromagnetic layer comprising a reversible magnetization direction; a pinned ferromagnetic layer comprising a fixed magnetization direction; and a tunnel barrier layer disposed between the free ferromagnetic layer and the pinned ferromagnetic layer,
    wherein the resistive memory element is a chalcogenide element and further comprising: a first electrode; a heater layer; a storage layer; and a second electrode, wherein the storage layer is disposed between the heater layer and the second electrode.

2. The memory cell of claim 1 wherein the free ferromagnetic layer comprises a magnetic material having a perpendicular anisotropy.

3. The memory cell of claim 1 wherein the free ferromagnetic layer comprises a magnetic material having an in-plane anisotropy.

4. The memory cell of claim 1 wherein the resistive memory element is a transition metal oxide element comprising:
    a first electrode;
    a second electrode; and
    a storage layer comprising a transition metal oxide and disposed between the first and second electrodes.

5. The memory cell of claim 1 wherein the thin film transistor is disposed above the plurality of resistive memory elements.

6. The memory cell of claim 1 wherein the thin film transistor is disposed below the plurality of resistive memory elements.

7. The memory cell of claim 1 wherein the semiconductor layer comprises at least one element selected from the group consisting of Si, Ge, C, As, Ga, Cd, Cu, In, Mo, Sb, Se, Sn, Te, Ti, Tl, and Zn.

8. A memory cell comprising:
    a substrate;
    a first plurality of resistive memory elements, each resistance memory element comprising an element width and two stable resistance states;
    a first plurality of parallel conductive lines disposed between the substrate and the first plurality of resistive memory elements and separately electrically coupled to the first plurality of resistive memory elements at their first ends;
    a second plurality of a resistive memory elements disposed above the first plurality of resistive memory elements, each resistive memory element comprising the element width and two stable resistance states;
    a second plurality of parallel conductive lines disposed above the second plurality of resistive memory elements and separately electrically coupled to the second plurality of resistive memory elements at their first ends; and
a thin film transistor disposed between the first plurality of resistive memory elements and the second plurality of resistive memory elements, comprising a gate width and a terminal,
wherein the first plurality of resistive memory elements and the second plurality of resistive memory elements are jointly electrically coupled to the terminal of the thin film transistor, and
wherein the gate width is substantially larger than the element width.

9. The memory cell of claim 8 wherein a resistive memory element comprises a reversible resistance.

10. The memory cell of claim 9 wherein the resistance of the resistive memory element is reversed by changing a direction of a current running through the resistive memory element in a direction perpendicular to a substrate surface.

11. The memory cell of claim 9 wherein the resistive memory element is a magnetoresistive element.

12. The memory cell of claim 9 wherein the resistive memory element is a transition metal oxide memory element.

13. The memory cell of claim 9 wherein the resistive memory element is a phase change element.

14. A memory cell comprising:
a substrate;
a first transistor comprising a first gate width and a terminal;
a first plurality of resistive memory elements disposed above the first transistor, each resistive memory element comprising an element width, a first end, and a second end;
a plurality of parallel conductive lines disposed above the first plurality of resistive memory elements and separately electrically coupled to the first plurality of resistive memory elements at their first ends;
a second plurality of resistive memory elements disposed above the plurality of parallel conductive lines, each resistive memory element comprising the element width, the first end, and the second end and separately electrically coupled to the plurality of conductive lines at their first ends;
a second transistor disposed above the second plurality of resistive memory elements and comprising a gate width and a terminal,
wherein the first plurality of resistive memory elements is jointly electrically coupled to the terminal of the first transistor at their second ends;
wherein the second plurality of resistive memory elements is jointly electrically coupled to the terminal of the second transistor at their second ends; and
wherein the gate width is substantially larger than the element width.

15. The memory cell of claim 14 wherein the first transistor is a metal-oxide-semiconductor transistor comprising a crystalline semiconductor material comprising at least one element selected from the group consisting of Si, Ge, C, As, and Ga.

16. The memory cell of claim 14 wherein the first transistor is a thin film transistor comprising a layer of a semiconductor material comprising at least one element selected from the group consisting of Si, Ge, C, As, Ga, Cd, Cu, In, Mo, Sb, Se, Sn, Te, Ti, Tl, and Zn.

17. The memory cell of claim 14 wherein the second transistor is a thin film transistor comprising a layer of a semiconductor material comprising at least one element selected from the group consisting of Si, Ge, C, As, Ga, Cd, Cu, In, Mo, Sb, Se, Sn, Te, Ti, Tl, and Zn.

* * * * *